United States Patent [19]

Wekell

[11] Patent Number: 5,450,284
[45] Date of Patent: Sep. 12, 1995

[54] HEAT SINK AND TRANSISTOR RETAINING ASSEMBLY

[75] Inventor: William O. Wekell, Renton

[73] Assignee: SpaceLabs Medical, Inc., Redmond, Wash.

[21] Appl. No.: 198,136

[22] Filed: Feb. 17, 1994

[51] Int. Cl.[6] ............................................. H05K 7/20
[52] U.S. Cl. .................................. 361/710; 257/719; 257/726; 361/717
[58] Field of Search ............... 174/16.3; 257/718, 719, 257/726, 727; 361/704, 707, 709–718, 722

[56] References Cited

U.S. PATENT DOCUMENTS

| | | | |
|---|---|---|---|
| 4,288,839 | 9/1981 | Prager et al. | 257/718 |
| 4,648,008 | 3/1987 | Neyroud et al. | 257/719 |
| 4,803,545 | 2/1989 | Birkle | 257/718 |
| 4,899,255 | 2/1990 | Case et al. | 361/710 |
| 5,225,965 | 7/1993 | Bailey et al. | 257/727 |
| 5,327,324 | 7/1994 | Roth | 257/727 |

FOREIGN PATENT DOCUMENTS

| | | | |
|---|---|---|---|
| 1236143 | 10/1986 | Japan | 257/718 |
| 4353044 | 12/1992 | Japan | 361/713 |

Primary Examiner—Gregory D. Thompson
Attorney, Agent, or Firm—Seed and Berry

[57] ABSTRACT

A heat sink and transistor retaining assembly for installation onto a printed circuit board. The assembly has a thermally conductive base plate forming a heat sink adapted to be disposed adjacent to the board, a first electric insulator attached to the base plate, a plurality of transistors positioned at predetermined positions against the first electric insulator so as to be electrically insulated from the base plate, a second electric insulator adjacent to the transistors with the transistors sandwiched between the insulators, and a resilient clamp attached to the base plate with the electric insulators and transistors positioned therebetween. The clamp has a plurality of retaining fingers that exert a retaining force on the transistors between the first and second insulators to retain the transistors in predetermined positions relative to the board. The assembly is secured together as a unit after its several components have been positioned in a fixture that supports and retains the component in predetermined positions.

21 Claims, 5 Drawing Sheets

HEAT SINK AND TRANSISTOR RETAINING ASSEMBLY

TECHNICAL FIELD

The present invention relates transistor to heat sinks, and more particularly, to heat sinks for a plurality of transistors mounted onto a printed circuit board of an electronic device.

BACKGROUND OF THE INVENTION

When electricity is passed through transistors mounted on a printed circuit board (hereinafter "the board"), the transistors, particularly power transistors, generate a substantial amount of heat. The heat must be drawn away from the transistors and dissipated to maintain low temperatures and to avoid damaging the transistors. Conventional transistor heat sinks are mounted on the cases of the transistors sink after electrical leads of the transistors have been inserted and soldered onto the board. However, the transistor case is often drawn against the heat sink when a mounting screw is tightened, so the electric leads have to bend. As a result, stress from bending forces is exerted on the leads and on solder joints that join the leads to the board, wherein the stress can lead to breakage or failure of the transistor.

A second conventional heat sink and transistor assembly includes a heat sink in the form of a cap structure having cooling fins that attach to and fit over one or more transistors. The cap structure is installed after the transistors are soldered to the board, so stress from bending and compression forces is exerted on the leads and solder joints during installation.

Strict manufacturing standards for, as an example, electronic medical devices, require that the case of a transistor have sufficient clearance over the surface of the board, and be spaced apart from other components. Conventional assemblies have experienced significant difficulties maintaining correct positioning of the transistors when they are attached to the board before being secured to a heat sink.

Regardless of which type of conventional heat sink is used, it is necessary to insert and then solder each transistor individually onto the printed circuit board. It is then necessary to perform the often laborious task of fastening one or more heat sinks to the transistor. As a result, manufacturing processes used during installation of the transistors onto the board are very labor intensive, time-consuming, and have a high risk of improper transistor positioning and excessive lead stress, thereby requiring costly rework of the assemblies.

Accordingly, there is a need for an assembly that permits heat sinks to be mounted on transistors and the transistors to be installed on a printed circuit board in a quick and inexpensive manner and in the proper positioning without stressing the transistor leads.

SUMMARY OF THE INVENTION

The present invention provides a heat sink and transistor retaining assembly mountable to a printed circuit board that retains, supports, and properly positions a plurality of transistors in known positions while minimizing stresses on transistor leads when the assembly is mounted onto the board. A preferred embodiment of the present invention has a thermally conductive base plate forming a heat sink, a plurality of transistors positioned and sandwiched between two electric insulators that are fastened to the heat sink, and a resilient clamp attached to the heat sink with the first and second electric insulators sandwiched therebetween. As such, the transistors are secured in the predetermined positions and adapted to be installed and electrically connected to the board as a unit. The clamp mounts onto the board with mounting legs that support the assembly perpendicular to the board. The clamp has a plurality of retaining fingers that exert a retaining force on each of the transistors to secure them between the electric insulators above the board.

The heat sink and transistor retaining assembly of the preferred embodiment is assembled using a fixture having a base with a datum surface representing the board and a plurality of apertures adapted to receive the transistor leads. A plurality of support pegs extend upward from the datum surface and are adapted to support the transistors at the predetermined positions over the datum surface and in a desired proper alignment. Each peg is positioned adjacent to at least one other support peg with two or more lead apertures between the two support pegs. The fixture further includes alignment guides to align the heat sink, the electric insulators, and the clamp in a consistent position, so the assembly can be manufactured by placing the assembly's individual components onto the fixture, fastening the components together and removing the assembly as a unit from the fixture, wherein the unit is ready to be mounted onto the board.

DETAILED DESCRIPTION OF THE INVENTION

Figure 1:
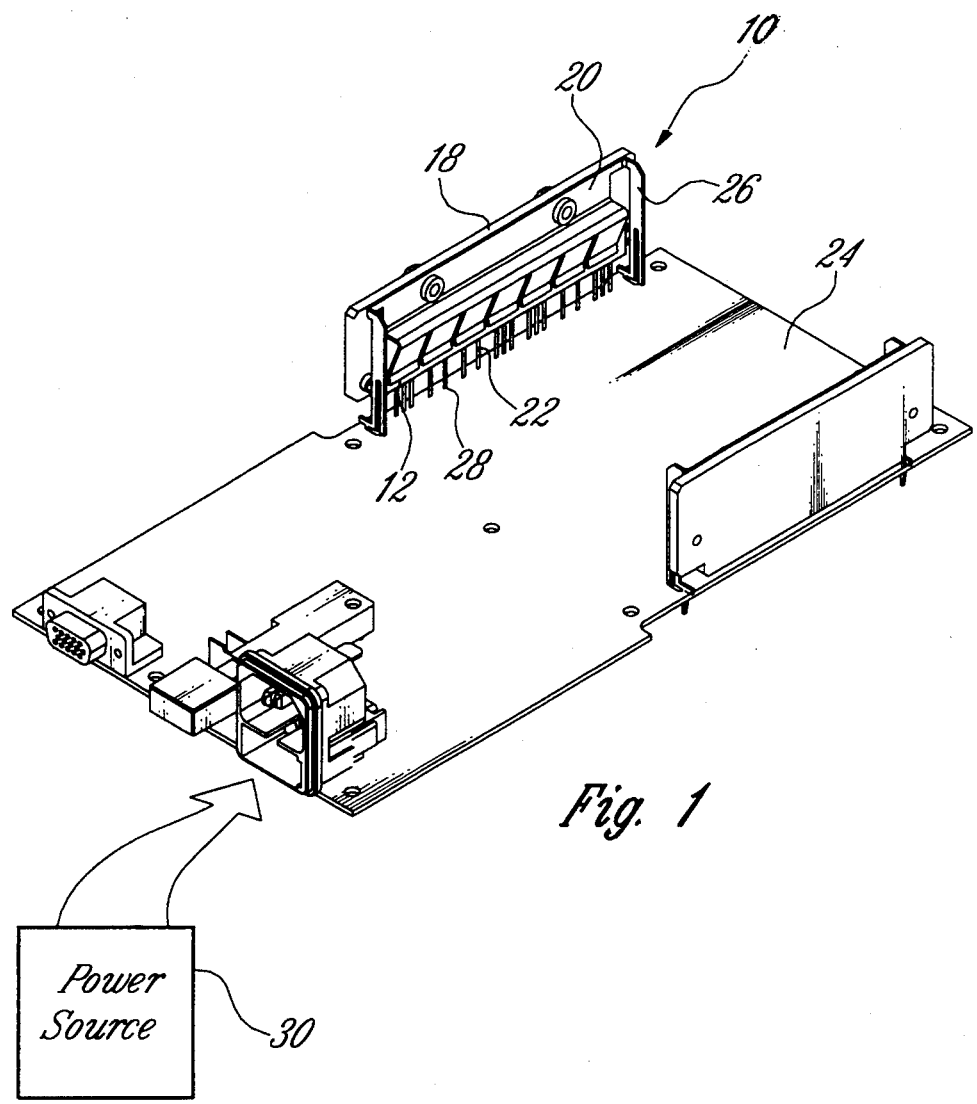
FIG. 1 is a top isometric view of two heat sink and transistor retaining assemblies, in accordance with the present invention, mounted on sides of a printed circuit board of an electronic device.

As shown in FIG. 1, a heat sink and transistor retaining assembly 10, in accordance with the present invention, has a plurality of transistors 12 positioned adjacent to a heat sink 18 and secured in place with a supporting clamp 20. The transistors 12 have leads 22 that extend downward below the heat sink 18 and are adapted to engage a printed circuit board 24. The assembly 10 attaches to the board 24 with the leads 22 in electrical contact with the board, which is mountable in, for example, a medical electronic device or the like. The assembly 10 is supported on the board 24 by mounting legs 26 on the clamp 20 that mount to the board so the transistors 12 are retained and supported at predetermined positions above the board with adequate spacing between adjacent transistors.

The assembly 10 holds the transistors 12 above the board 24 such that the bottom ends of the leads 22 can be passed through lead apertures 28 in the board 24 and wave soldered or otherwise electrically connected to the board. When electricity from a power source 30 or the like is passed through the board 24 and through the transistors 12, the transistors generate a substantial amount of heat. The heat sink 18 adjacent to the transistors 12 draws the heat away from the transistors to the heat sink, and the heat is then dissipated away from the heat sink. As a result, the assembly 10 acts to support the plurality of transistors 12 in positions that, for example, conform to strict manufacturing standards, and that allow the transistors to be properly installed on the board by mounting the assembly onto the board 24 as a unit.

Figure 2:
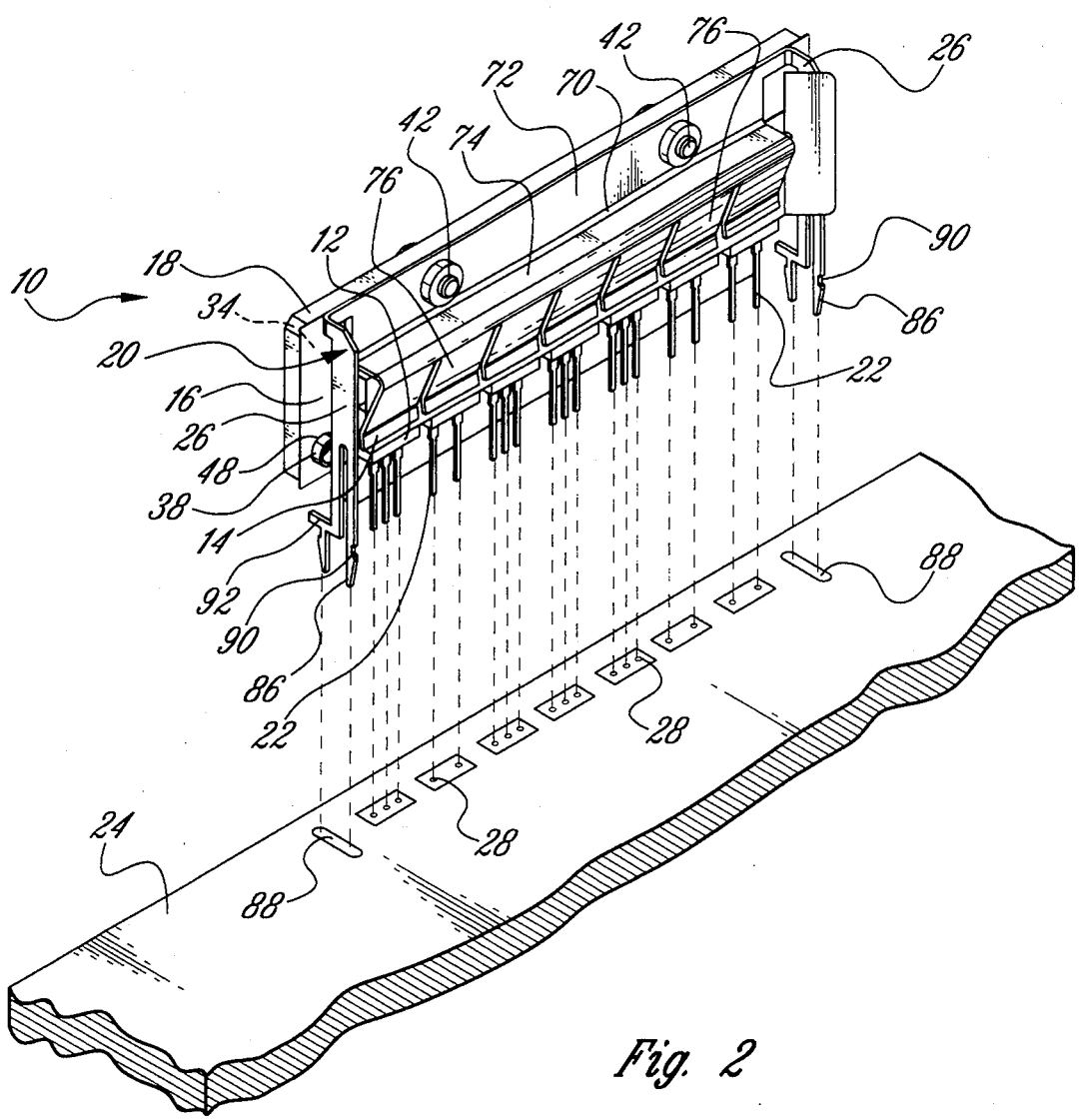
FIG. 2 is an enlarged, exploded top isometric view of one of the heat sink and transistor retaining assemblies of FIG. 1 having seven transistors, with the board being partially cut away.
Figure 3:
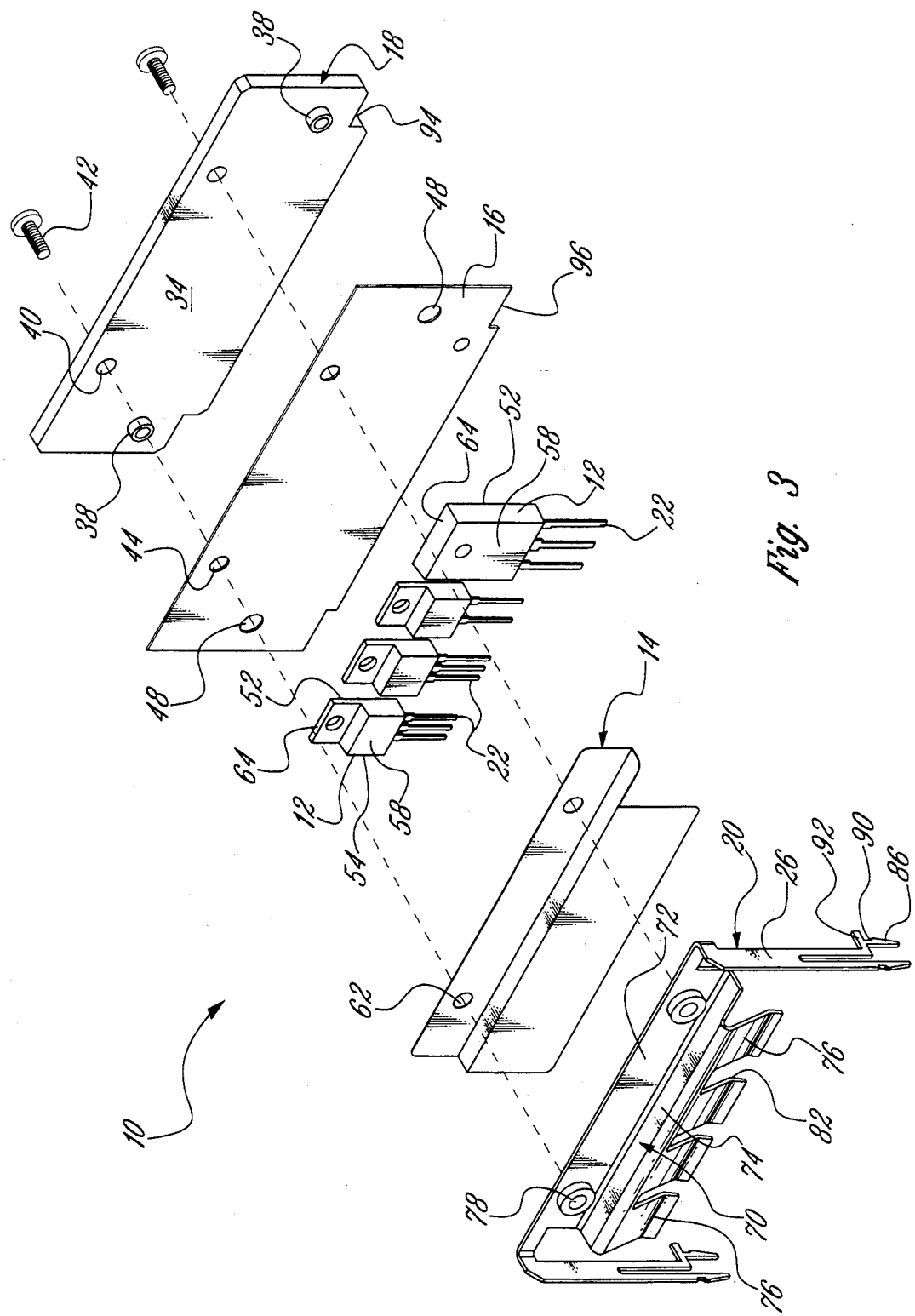
FIG. 3 is an enlarged, exploded top isometric view of the second heat sink and transistor retaining assembly of FIG. 1 having four transistors removed from the board.

As best seen in FIGS. 2 and 3, the transistors 12 are sandwiched between a forward and rear electric insulators 14 and 16, and the sandwich structure is clamped against the heat sink 18. The heat sink 18 is a vertically oriented plate of aluminum or other thermally conductive material, that has alignment bosses 38 that extend forwardly from a forward planar mounting surface 34. The alignment bosses 38 pass through respective alignment holes 48 in the rear insulator 16 to position the insulator 16 in the proper position flush with the mounting surface 34. As best seen in FIG. 3, fastener apertures 40 are foraged in the top portion of the heat sink 18 and receive screws 42 that are threaded into threaded bosses 78 attached to a support plate 72 of the clamp 20 to fasten the assembly 10 together.

The rear insulator 16 is a plate of thermally conductive plastic or other suitable material that is not electrically conductive. The rear insulator 16 is shaped and sized to fully cover the mounting surface 34 of the heat sink 18, and fastener apertures 44 in the top portion of the rear insulator align with the fastener apertures 40 in the heat sink 18. In the preferred embodiment, the bottom portion of the rear insulator 16 extends below a bottom edge of the heat sink 18 to prevent the heat sink from coming into contact with the board 24.

The transistors 12 have a backsurface a body 54 with 52 that is pressed against the rear insulator 16, and the leads 22 extend downward from the bottom of the transistor body parallel to the rear insulator. Accordingly, the backsurfaces 52 of the transistors 12 only contact the rear insulator 16, so they are completely insulated, electrically, from the heat sink 18.

The forward insulator 14 is positioned against a front surface 58 of the transistors 12 and is attached to the rear insulator 16, such that the transistors 12 are sandwiched between the insulators. In the preferred embodiment, the forward insulator 14 is a contoured, thermally conductive plastic sheet, or other suitable material that is not electrically conductive, that has a vertically oriented top portion with fastener apertures 62 therein. The top portions of the forward and rear insulators 14 and 16 have approximately the same shape and size and are pressed against each other, so the fastener apertures 44 and 62 in the insulators coaxially align.

The forward insulator 14 is contoured to electrically isolate the tops 64 and front surfaces 58 of the transistors 12. A horizontal section of the forward insulator 14 located below the top portion, extends over the tops 64 of the transistors 12. The bottom portion of the forward insulator 14 extends vertically downward from the horizontal section, covers the front surfaces 58 of the transistors 12, and terminates just below the bottom of the transistor bodies 54. Accordingly, the transistors 12 are surrounded by the insulators 14, 16 on the back 52, top 64, and front surfaces 58, with the bottom being open so the leads 22 can extend downwardly in an unobstructed manner from the transistor bodies parallel to the rear insulator 16 and attach to the board.

As best seen in FIG. 3, the clamp 20 has a body portion 70 that connects to the top of the mounting legs 26. The body portion 70 substantially follows the contour of the forward insulator 14 and has a vertically oriented support plate 72 that connects to a horizontal section 74, which extends over the tops 64 of the transistors 12. The horizontal section 74 connects to a plurality of resilient retaining fingers 76 that extend downward therefrom and slope rearward toward the transistors 12. The retaining fingers 76 exert a retaining force on the transistors 12 sandwiched between the insulators 14 and 16 so as to hold the transistors in the predetermined positions.

The support plate 72 is secured to the top portion of the heat sink 18, so the top portions of the forward and rear insulators are sandwiched between the clamp and the heat sink. As mentioned above, the support plate 72 also has secured thereto threaded bosses 78 that coaxially align with fastener apertures 44 and 62 in the insulators 14 and 16 and with the fastener apertures 40 in the heat sink 18. Accordingly, the assembly 10 is securely fastened together by the two screws 42, that extend through the fastener apertures, 44, 62 and 40 and engage the threaded bases 78.

The clamp 20 of the preferred embodiment has one respective resilient retaining finger 76 for each of the transistors 12. Each of the retaining fingers 76 has a bottom portion that bends and flares forward away from the transistor 12, so as to provide a smooth, horizontal engagement portion 82 that presses against the bottom portion of the forward insulator 14. The clamp 20 is a resilient metal, such as stainless steel or the like, that will allow the retaining fingers 76 to deflect slightly when the clamp is fastened to the heat sink 18 and pressed against the forward insulator 14 and transistors 12. This deflection of the retaining fingers 76 exerts the retaining force on the transistors 12 to support them in a predetermined position with adequate spacing relative to adjacent transistors. Although the preferred embodiment uses stainless steel, other suitable materials can be used.

Each of the two mounting legs 26 of the clamp 20 have a forked bottom portion with two downwardly extending tines 86 that are adapted to be inserted into apertures 88 formed in the printed circuit board 24, as seen in FIG. 2, and to retain the assembly 10 on the board. The tines 86 have notches 90 formed therein that receive the board 24 around the apertures 88 to lock the tines 86 in their respective apertures 88 when the mounting legs 26 are pushed into engagement with the board. As such, the mounting legs 26 support the assembly 10 substantially perpendicular to the board 24, with the transistors 12 and leads 22 positioned over the lead apertures 28 in the board. The mounting legs 26 provide support for the assembly 10, in part because they are oriented perpendicular to the support plate 72 so the mounting legs extend in the fore and aft direction and provide stability to the assembly 10 when it is mounted onto the board 24.

Additional support is provided to the assembly 10 by stabilizing shoulders 92 that are connected to the rear tines 86 of the mounting legs 26. The stabilizing shoulder 92 is a horizontal member extending rearwardly from rear tine 86 of each mounting leg 26, that rest on the upper surface of the board when the assembly 10 is installed thereon. Accordingly, the stabilizing shoulder 92 protects against the assembly 10 tipping over after being mounted to the board 24, and, thus, the assembly is a self supporting unit mountable on the board. As best seen in FIG. 3, the stabilizing shoulder 92 extends through cut out areas 94 and 96 formed in the lower corners of the heat sink 18 and the rear insulator 16 to avoid interference with the heat sink and rear insulator while maximizing the size and area of the electrically insulated heat sink.

Accordingly, the assembly 10 provides a structure that holds and retains the transistors 12 perpendicular to the board 24 with the transistor bodies 54 at predetermined distances above the board and with the leads 22 extending downwardly through the lead apertures 28 and connecting to the board without bending forces being exerted on the leads.

Figure 5:
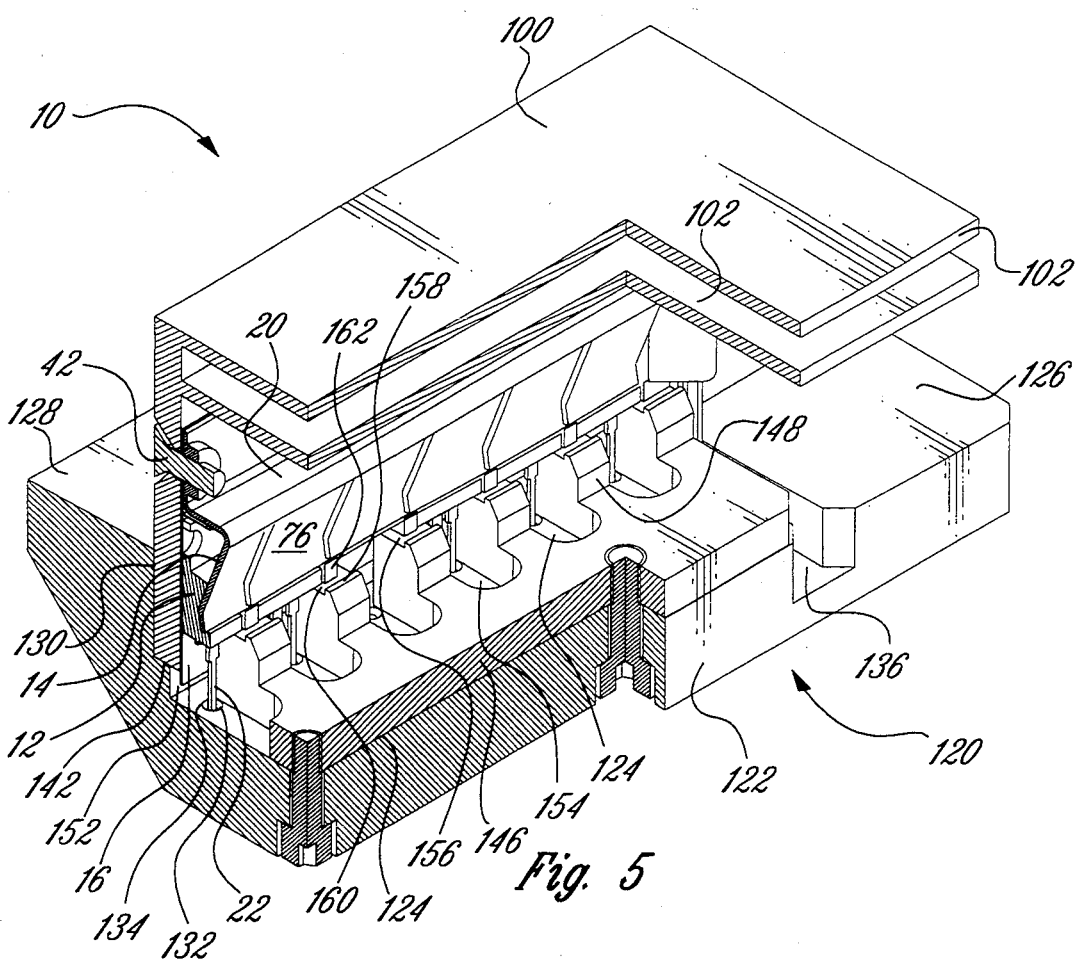
FIG. 5 is an enlarged, partially cut away top isometric view of an alternate embodiment of the heat sink and transistor retaining assembly of FIG. 4 having a heat sink with two fins.

As best seen in FIG. 5, an alternate embodiment of the present invention has a heat sink 100 that attaches to the forward and rear electric insulators 14 and 16, the transistors 12, and the clamp 20 as discussed above. The alternate heat sink 100 has two horizontally aligned fins 102 that are integrally attached to the top portion of the heat sink and extend forwardly over the assembly 10. The fins 102 provide additional surface area of the heat sink 100, which improves the performance of the heat sink to allow for greater dissipation of the heat generated from the transistors when electricity is passed therethrough. Although the heat sink 100 of the alternate embodiment incorporates two integral fins, a greater or lesser number of fins can be used to achieve a desired heat sink performance. In addition, the fins 102 can be removable or otherwise not integral to the body of the heat sink 100 to, for example, facilitate manufacturing or the like.

Figure 4:
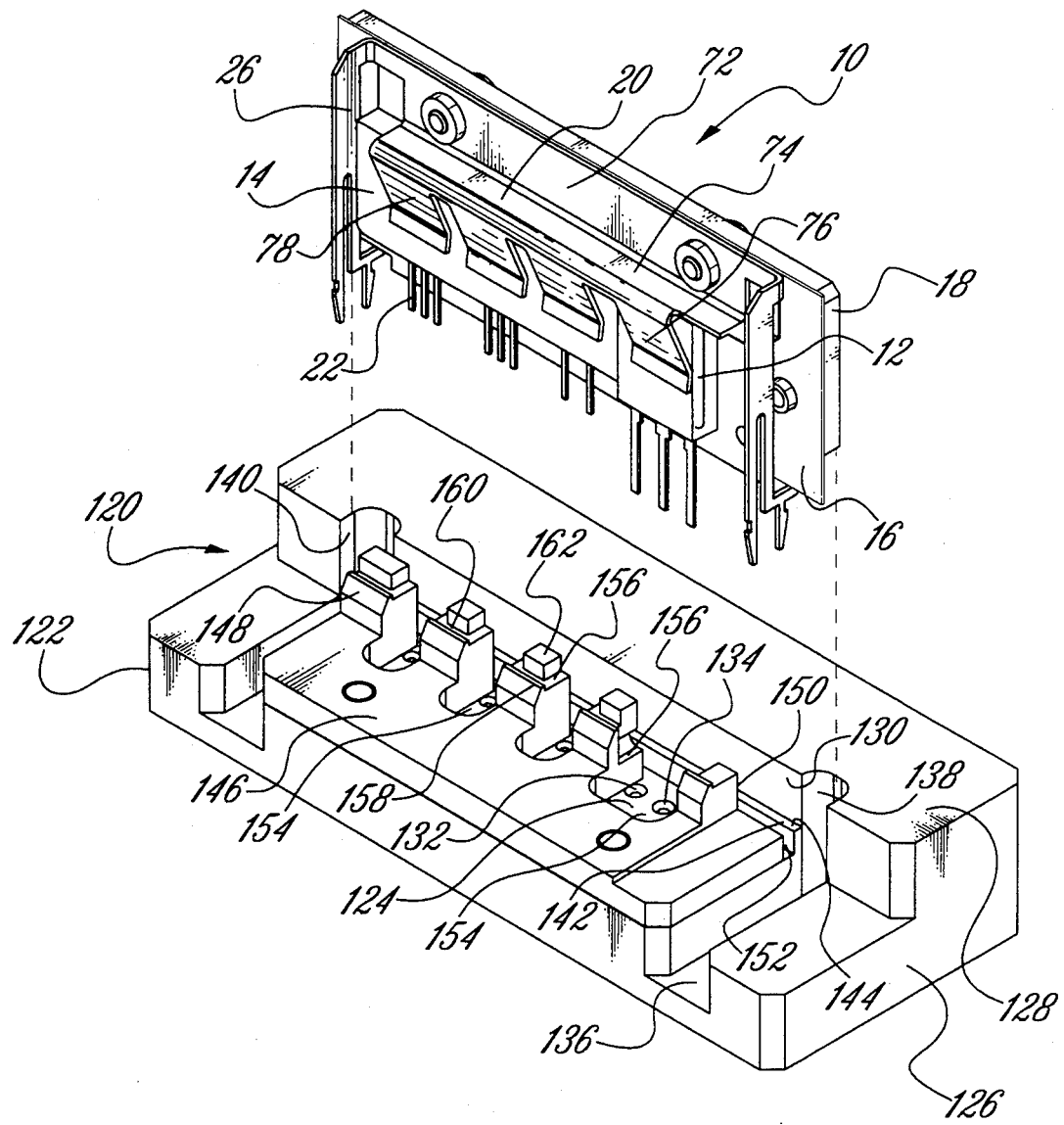
FIG. 4 is a reduced, top isometric view of the heat sink and transistor retaining assembly of FIG. 3 positioned over a fixture, in accordance with the present invention, that is used to assemble the heat sink and transistor retaining assembly.

To achieve precise positioning of the transistors, as often is required by strict manufacturing standards, a fixture 120, as best seen in FIGS. 4 and 5 is used to position the several components of the assembly 10 in correct positions with proper spacing and orientation, whereby the assembly 10 can be fastened together, removed as a unit, and placed directly onto a printed circuit board with all of the components in their proper positions.

The fixture 120 of the preferred embodiment has a base 122 with a lower forward section 126 and a raised rearward section 128, wherein the top of the lower section is flat and forms a horizontal datum surface 124 representing the top surface of the printed circuit board. The raised section 128 is integral with the lower section 126 and extends upward from the datum surface 124 so as to form a vertical back wall 130 that is perpendicular to the datum surface. The lower section 126 has a plurality of lead apertures 132 formed therein forward of the back wall 130 and arranged parallel to the back wall. The lead apertures 132 are positioned along the datum surface 124 so as to receive the leads 22 of the transistors 12. In a preferred embodiment, the lead apertures 132 have counter-sunk top portions 134 that facilitate insertion of the leads 22 into the apertures.

As best seen in FIG. 4, slots 136 extend along left and right sides of the lower section 126 and terminate at clamp receiving areas 138 formed in the back wall 130. The receiving areas 138 are shaped and sized to receive the mounting legs 26 of the clamp 20, so the clamp can be moved laterally through the slots 136 and into an installation position in the receiving area with the support plate 72 adjacent to the back wall 130. Each of the receiving areas 138 has outer sidewalls 140 that are located apart from each other a distance that is slightly greater than the length of the heat sink 18, so the outer sidewalls form a keyway that positions the heat sink on the fixture 120 in a desired position.

A heat sink stop 142 is attached to the datum surface 124 and extends upward along the back wall 130. The heat sink stop 142 has a flat top surface 144 that is adapted to support the heat sink 18 at a predetermined position above the datum surface 124. In the preferred embodiment, the heat sink stop 142 is integral with the lower section 126 and with the back wall 130 of the raised section 128.

A plate structure 146 having a plurality of support pegs 148 along its rear portion is fastened to the datum surface 124 between the slots 136. The support pegs 148 are positioned parallel to the back wall and are spaced apart a distance that allows a transistor to span between two adjacent support pegs and be carried by the support pegs at the predetermined distance above the datum surface 124.

Figure 6:
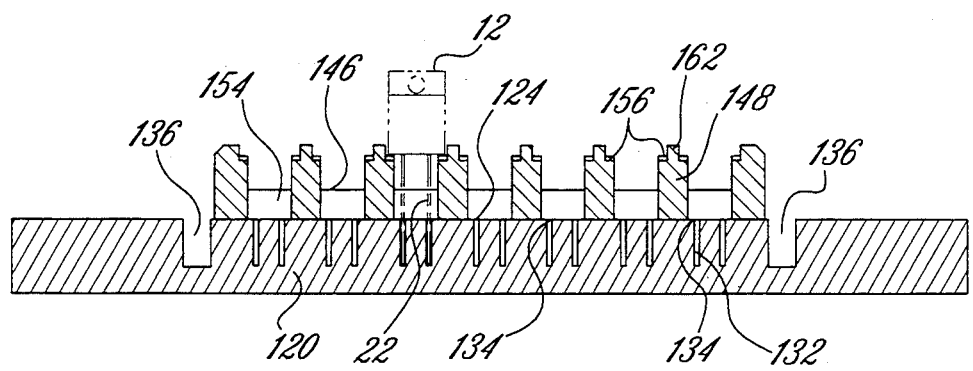
FIG. 6 is a cross-sectional view taken substantially along line 6—6 of FIG. 4.

As best seen in FIGS. 4 and 6, the plate structure 146 has a plurality of recessed areas 154 between the support pegs 148 that are shaped so the lead apertures 132 are accessible and so the transistors 12, shown in phantom lines, can be placed onto the support pegs with the leads 22 extending downward and into the lead apertures 132. Each of the support pegs 148 has at least one shoulder portion 156 that receives one side of a transistor 12 such that a transistor is fully supported by setting on the shoulder portions of two support pegs. In addition, the shoulder portion 156 of one support peg 148 located on, for example, a left side of a recessed area 154 is located at the same distance above the datum surface 124 as the shoulder portion of an adjacent support peg on the right side of the same recessed area. Accordingly, when a transistor 12 is positioned onto the shoulder portions 156, the transistor is supported with a predetermined alignment and is positioned at a predetermined distance above the datum surface 124.

In one embodiment of the fixture, the shoulder portions 156 of the support pegs 148 are all located at a same distance above the datum surface 124, because only one type of transistor is used in the assembly that is assembled in that fixture. In an alternative embodiment of the fixture, the shoulder portions 156 on different sides of a support peg 148 are at different distances above the datum surface 124 because adjacent transistors 12 in an assembly that is assembled in that fixture are to be arranged with different clearances over the board. However, the shoulder portions 156 located on opposite sides of a recessed area 154 are the same distance above the datum surface 124 so the leads 22 of the transistor 12 will be perpendicular to the board 24.

In the preferred embodiment illustrated in FIG. 4, support pegs 148 have rear sidewalls 150 located forward of the heat sink stop 142 so a gap 152, as best seen in FIG. 5, is formed between the support pegs 148 and the heat sink stop. This gap 152 has a thickness slightly greater than the thickness of the rear insulator 16. When the heat sink 18 is placed between the sidewalls 140 and on the heat sink stop 142, the rear insulator 16 is installed adjacent to the heat sink with the bottom portion of the rear insulator extending into the gap 152 below the bottom of the heat sink.

In the preferred embodiment, each support peg 148 has a retaining lip 158 that engages a transistor body 54 and blocks it from inadvertently sliding off the forward edge of the support peg. In addition, a block 162 is attached to the top of the support peg 148 so as to form a channel 160 between the block and the retaining lip 158. The channels 160 are sized to receive the forward insulator 14 and to retain it next to the transistors 12 on the support pegs 148.

As best seen in FIG. 5, the fixture 120 is used to position and join the components of the assembly 10. After the heat sink 18 is positioned in the fixture 120 on the heat sink stop 142, and the rear insulator 16 is placed adjacent the heat sink and in the gap 152, as discussed above, a plurality of transistors 12 are set onto the support pegs 148 so the transistor bodies 54 are adjacent to the rear insulator 16 and the electric leads 22 extend into the lead apertures 132. Thereafter, the forward insulator 14 is set onto the support pegs 148 in the channels 160 so the transistors 12 are sandwiched between the insulators 14 and 16. The clamp 20 is moved into position against the forward insulator 14 with the mounting legs 26 passing through the slots 136 of the fixture 120. When the clamp 20 is in position, the fasteners 42 are installed and securely fasten the assembly together as a unit so the retaining fingers 76 of the clamp 20 exert the retaining force against the transistors 12 and hold them in the predetermined position relative to the datum surface. After the assembly is fastened together, it is raised out of the fixture 120 as a unit and thereafter installed into the printed circuit board, as discussed above.

Numerous modifications and variations of the invention disclosed herein will occur to those skilled in the art in view of this disclosure. For example, the transistors may be replaced with other electronic components having body portions and electric leads that are mountable in a printed circuit board or other similar retaining device. Therefore, it is to be understood that these modifications and variations, and equivalents thereof may be practiced while remaining within the spirit and the scope of the invention as defined by the following claims.

We claim:

1. A heat sink and transistor retaining assembly that is adapted to be installed onto a printed circuit board coupled to a source of electricity, comprising:
   a heat sink having a bottom edge portion adapted to be disposed adjacent said printed circuit board when said heat sink projects perpendicularly from a surface of said printed circuit board, said heat sink having a planar mounting surface and being a thermally conductive material;
   a first electric insulator mounted on said planar mounting surface of said heat sink said first electric insulator being thermally conductive;
   a plurality of transistors positioned against said first electric insulator, whereby said transistors are electrically insulated from said heat sink, each of said transistors having electric leads that extend below said bottom edge of said heat sink and that are adapted to engage said printed circuit board, said transistors generating heat when the electricity is passed therethrough, whereby said heat passes through said first electric insulator to said heat sink and dissipates from said heat sink;
   a second electric insulator positioned adjacent said transistors with said transistors sandwiched between said first and second electric insulators; and
   a resilient clamp attached to said heat sink, said clamp having a resilient retaining member that exerts a retaining force on said transistors through said second electric insulator to retain said transistors between said first and second electric insulators in predetermined positions, whereby said transistors are supported in the predetermined positions prior to being connected to said printed circuit board, said resilient retaining member having a respective resilient retaining finger for each of said transistors, said retaining fingers being connected to a common support plate that is secured to said heat sink, said retaining fingers exerting said retaining force on said transistors.

2. The heat sink and transistor assembly of claim 1 wherein at least one of said clamp and heat sink has means for mounting said assembly onto said printed circuit board.

3. The heat sink and transistor retaining assembly of claim 1 wherein each of said transistors is supported in a selected one of the predetermined positions, the predetermined positions being at a same distance above the bottom edge of the heat sink.

4. The heat sink and transistor retaining assembly of claim 1 wherein each of said transistors is supported in a selected one of the predetermined positions, the predetermined positions being more than one distance above the bottom edge of the heat sink.

5. The heat sink and transistor retaining assembly of claim 1 wherein said heat sink has at least one fin.

6. The heat sink and transistor retaining assembly of claim 1 wherein said heat sink is aluminum.

7. The heat sink and transistor retaining assembly of claim 1 wherein said first and second electric insulators are plastic.

8. The heat sink and transistor retaining assembly of claim 1, further comprising alignment means connected to said heat sink and adapted to align said first electric insulator against said base plate.

9. A printed circuit board assembly comprising:
   a printed circuit board having a plurality of lead apertures and at least one retaining aperture said printed circuit board being adapted to connect to a source of electricity:
   a heat sink having a bottom edge portion adapted to be disposed adjacent said printed circuit board when said heat sink projects perpendicularly from a surface of said printed circuit board, said heat sink having a planar mounting surface and being a thermally conductive material;
   a first electric insulator mounted on said planar mounting surface of said heat sink, said first electric insulator being thermally conductive;
   a plurality of transistors positioned against said first electric insulator, whereby said transistors are electrically insulated from said heat sink, each of said transistors having electric leads that extend below said bottom edge of said heat sink and through said lead apertures in said printed circuit board, said transistors generating heat when the electricity is passed therethrough, whereby said heat passes through said first electric insulator to said heat sink and dissipates from said heat sink;

a second electric insulator positioned adjacent said transistors with said transistors sandwiched between said first and second electric insulators; and a resilient clamp attached to said heat sink, said clamp having a resilient retaining member that exerts a retaining force on said transistors through said second electric insulator to retain said transistors between said first and second electric insulators in predetermined positions, whereby said transistors are supported in the predetermined positions prior to being connected to said printed circuit board, said resilient retaining member having a respective resilient retaining finger for each of said transistors, said retaining fingers being connected to a common support plate that is secured to said heat sink, said retaining fingers exerting said retaining force on said transistors.

10. The printed circuit board assembly of claim 9 wherein at least one of said clamp and heat sink has means engaging said printed circuit board at said at least one retaining aperture for mounting said assembly onto said printed circuit board.

11. The printed circuit board assembly of claim 9 wherein each of said transistors is supported in a selected one of the predetermined positions, the predetermined positions being at a stone distance above the bottom edge of the heat sink.

12. The printed circuit board assembly of claim 9 wherein each of said transistors is supported in a selected one of the predetermined positions, the predetermined positions being more than one distance above the bottom edge of the heat sink.

13. The printed circuit board assembly of claim 9 wherein said heat sink has at least one fin.

14. The printed circuit board assembly of claim 9 wherein said heat sink is aluminum.

15. The printed circuit board assembly of claim 9 wherein said first and second electric insulators are plastic.

16. The printed circuit board assembly of claim 9, further comprising alignment means connected to said heat sink and adapted to align said first electric insulator against said heat sink.

17. A heat sink and transistor retaining assembly that is adapted to be installed onto a printed circuit board coupled to a source of electricity, comprising:

a heat sink having a bottom edge portion adapted to be disposed adjacent said printed circuit board when said heat sink projects perpendicularly from a surface of said printed circuit board said heat sink having a planar mounting surface and being a thermally conductive material;

a first electric insulator mounted on said planar mounting surface of said heat sink, said first electric insulator being thermally conductive;

a plurality of transistors positioned against said first electric insulator, whereby said transistors are electrically insulated from said heat sink, each of said transistors having electric leads that extend below said bottom edge of said heat sink and that are adapted to engage said printed circuit board said transistors generating heat when the electricity is passed therethrough, whereby said heat passes through said first electric insulator to said heat sink and dissipates from said heat sink;

a second electric insulator positioned adjacent said transistors with said transistors sandwiched between said first and second electric insulators;

a resilient clamp attached to said heat sink, said clamp having a resilient retaining member that exerts a retaining force on said transistors through said second electric insulator to retain said transistors between said first and second electric insulators in predetermined positions, whereby said transistors are supported in the predetermined positions prior to being connected to said printed circuit board; and alignment means connected to said heat sink and adapted to align said first electric insulator against said base plate.

18. The heat sink and transistor assembly of claim 17 wherein at least one of said clamp and heat sink has means for mounting said assembly onto said printed circuit board.

19. The heat sink and transistor retaining assembly of claim 17 wherein each of said transistors is supported in a selected one of the predetermined positions, the predetermined positions being at a same distance above the bottom edge of the heat sink.

20. The heat sink and transistor retaining assembly of claim 17 wherein each of said transistors is supported in a selected one of the predetermined positions, the predetermined positions being more than one distance above the bottom edge of the heat sink.

21. The heat sink and transistor retaining assembly of claim 17 wherein said heat sink has at least one fin.

* * * * *

UNITED STATES PATENT AND TRADEMARK OFFICE
CERTIFICATE OF CORRECTION

PATENT NO. : 5,450,284
DATED : September 12, 1995
INVENTOR(S) : William O. Wekell It is certified that error appears in the above-indentified patent and that said Letters Patent is hereby corrected as shown below:

In column 7, claim 1, line 57, after "sink" and before "said", please insert --,--.

In column 7, claim 1, line 68, after "sink", please delete ":" and insert therefor --;--.

In column 8, claim 9, line 48, after "electricity", please delete ":" and insert therefor --;--.

In column 9, claim 11, line 26, after "a" and before "distance", please delete "stone" and insert therefor --same--.

In column 10, claim 17, line 1, after "board" and before "said", please insert --,--.

In column 10, claim 17, line 12, after "board" and before "said", please insert --,--.

Signed and Sealed this

Ninth Day of January, 1996

*Attest:*

BRUCE LEHMAN

*Attesting Officer*    Commissioner of Patents and Trademarks